(12) United States Patent
Hung et al.

(10) Patent No.: US 6,396,753 B1
(45) Date of Patent: May 28, 2002

(54) METHOD AND STRUCTURE FOR TESTING EMBEDDED FLASH MEMORY

(75) Inventors: Chun-Hsiung Hung; Nai-Ping Kuo; Tu-Shun Chen; Ho-Chun Liou, all of Hsinchu (TW)

(73) Assignee: Macroniz International Co., Ltd., Hsinchu (TW)

( * ) Notice: Subject to any disclaimer, the term of this patent is extended or adjusted under 35 U.S.C. 154(b) by 0 days.

(21) Appl. No.: 09/826,497

(22) Filed: Apr. 5, 2001

(51) Int. Cl.$^7$ ................................................. G11C 7/00
(52) U.S. Cl. ................................... 365/201; 365/185.09
(58) Field of Search ........................... 365/201, 189.08, 365/185.09

(56) References Cited

U.S. PATENT DOCUMENTS 5,930,188 A * 7/1999 Roohparvar ................. 365/201
6,243,307 B1 * 6/2001 Kawagoe ..................... 365/201

* cited by examiner

Primary Examiner—A. Zarabian
(74) Attorney, Agent, or Firm—Powell, Goldstein, Frazer & Murphy LLP

(57) ABSTRACT

A method and structure for testing embedded flash memory including a memory array and a logic element. A control transistor is disposed and is connected between a sense amplifier and an I/O buffer in the memory array, and a speed control pin connected to the logic element in one terminal is coupled to the gate terminal of the control transistor in the other terminal to switch the control transistor on or off. Turning off the control transistor after a test time by the speed control pin closes the channel between the sense amplifier and I/O buffer, and an output signal from the memory array to a test system connected to the logic element is detected with the test system to determine an access time of the memory array.

12 Claims, 4 Drawing Sheets

METHOD AND STRUCTURE FOR TESTING EMBEDDED FLASH MEMORY

FIELD OF THE INVENTION

The present invention relates to a semiconductor memory, and more particular to a method and circuit for testing an embedded flash memory including memory and logic element formed in a single integrated circuit.

BACKGROUND OF THE INVENTION

Advances in the design and fabrication of integrated circuits have resulted in significant decreases in the size of transistors and other components for forming such integrated circuits. Such dramatic increases in the density of components have enabled manufacturers to fabricate high capacity memory devices in the same size substrate previously produced much lower capacity devices. Likewise, for microprocessors and other logic circuits, such increased component density has enabled manufacturers to increase functionality by including additional circuitry on the substrate. In addition to improving functionality and performance of existing types of integrated circuits, a new type of integrated circuit called an "embedded flash memory" in which the logic element and the flash memory (or called EEPROM flash memory) formed in the same integrated circuit is developed. In other words, the logic element is "embedded" in the flash memory.

Referring to FIG. 1, a block diagram of embedded flash memory in the prior art. In the embedded flash memory 100, a flash memory array 110 and a logic element 120 are formed in the same semiconductor substrate. The logic element 120 is connected to the memory array 110 through an address pin 112, control pin 114 and data pin 116, and control address, control and data signal on these respective pins to transfer data to and from the memory array 110.

There are numerous performance benefits from the embedded flash memory of which the memory array 110 and the logic element 120 are formed in the same semiconductor substrate. The bandwidth of the memory array 110 can be substantially increased by increasing the width of data pin 116 to transfer more data during each access action of the memory array 110. Moreover, the embedded flash memory 100 has additional advantages of lower power consumption and lower electromagnetic radiation than the conventional flash memory.

During the manufacture of the embedded flash memory 100, the embedded flash memory 100 needs to be tested just as with conventional flash memory. However, testing the embedded flash memory presents new problems not encountered in conventional flash memories. As shown in FIG. 1, a test system 200 is generally connected to the logic element 120 through an external terminal 130 of the logic element 120 to transfer test address, control and data signal for accessing data of the memory array 110. The transferred test signals to the memory array 110 must transmit through the logic element 120 first, and the output data signals also must pass the logic element 120 and then to the test system 200. Therefore, the actual access time is total access time passing though the logic element 120, not an access time of memory array 110.

In order to dominate actual access time of the memory array of the Embedded flash memory to overlook whether achieving predetermined operation performance, there is a need for testing the access time of the memory array.

SUMMARY OF THE INVENTION

Therefore, the present invention provides a method for testing memory array in an embedded flash memory including a memory array and a logic element, and the memory array connected to a test system through the logic element, comprising:

a) testing the memory array to obtain an original access time;

b) gating an output signal from the memory array to the test system by a speed control pin after a first test time and detecting the output signal with the test system;

c) if the test system detecting the output signal, iterating the step (b) with a second test time; and d) obtaining a memory array access time if the test system detecting the output signal in step (c).

The present invention also provides a gating circuit for testing a memory array in an embedded flash memory including a memory array and a logic element. The memory array is connected to a test system through the logic element. The gating circuit comprises a control transistor connected between a sense amplifier and an I/O buffer, and a speed control pin connected between the logic element and a gate terminal of the control transistor to gate an output signal from the memory array to the test system by switching the control transistor on or off. The control transistor may be a NMOS transistor, PMOS transistor, depletion mode NMOS transistor or depletion mode PMOS transistor.

By gating the output signal from the memory array to the logic element during shortening test time for test system step by step, the output signal is detected to obtain the memory array access time conveniently and precisely.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides a method and structure for testing embedded flash memory to obtain a memory array access time of the embedded flash memory conveniently and precisely.

Figure 1:
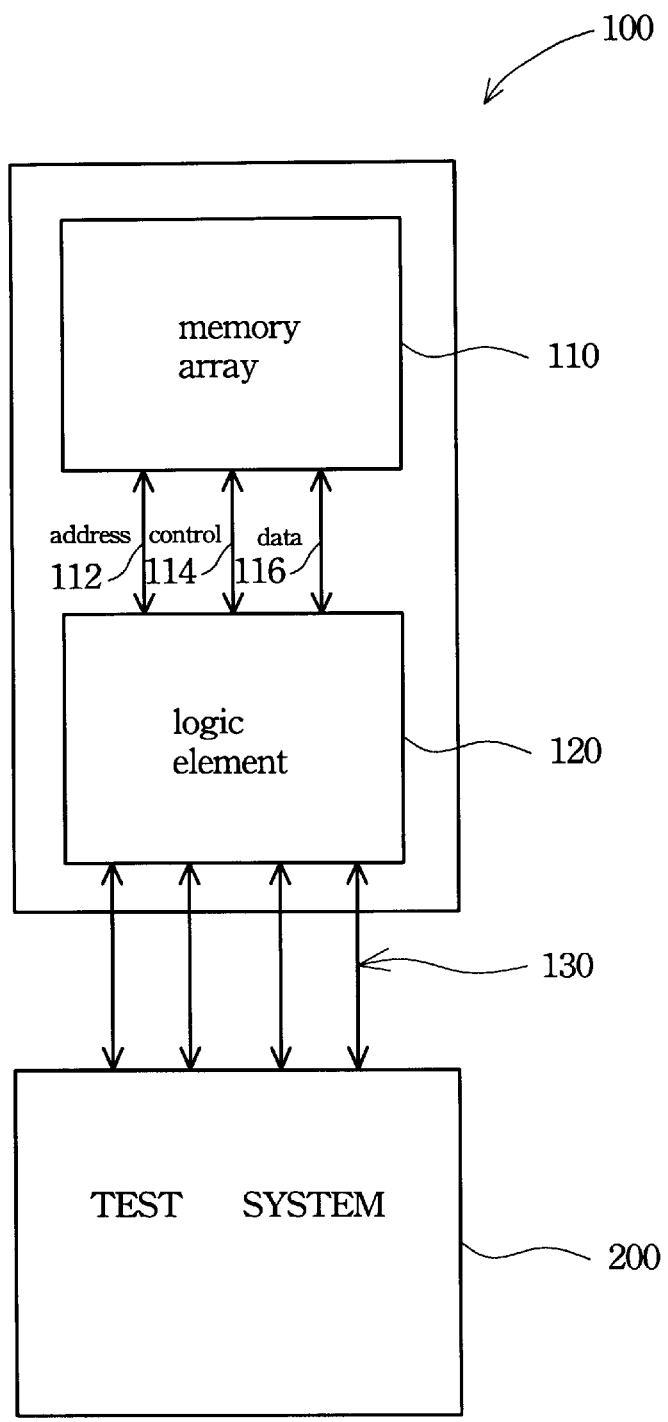
FIG. 1 is a functional block diagram of embedded flash memory in the prior art.
Figure 2:
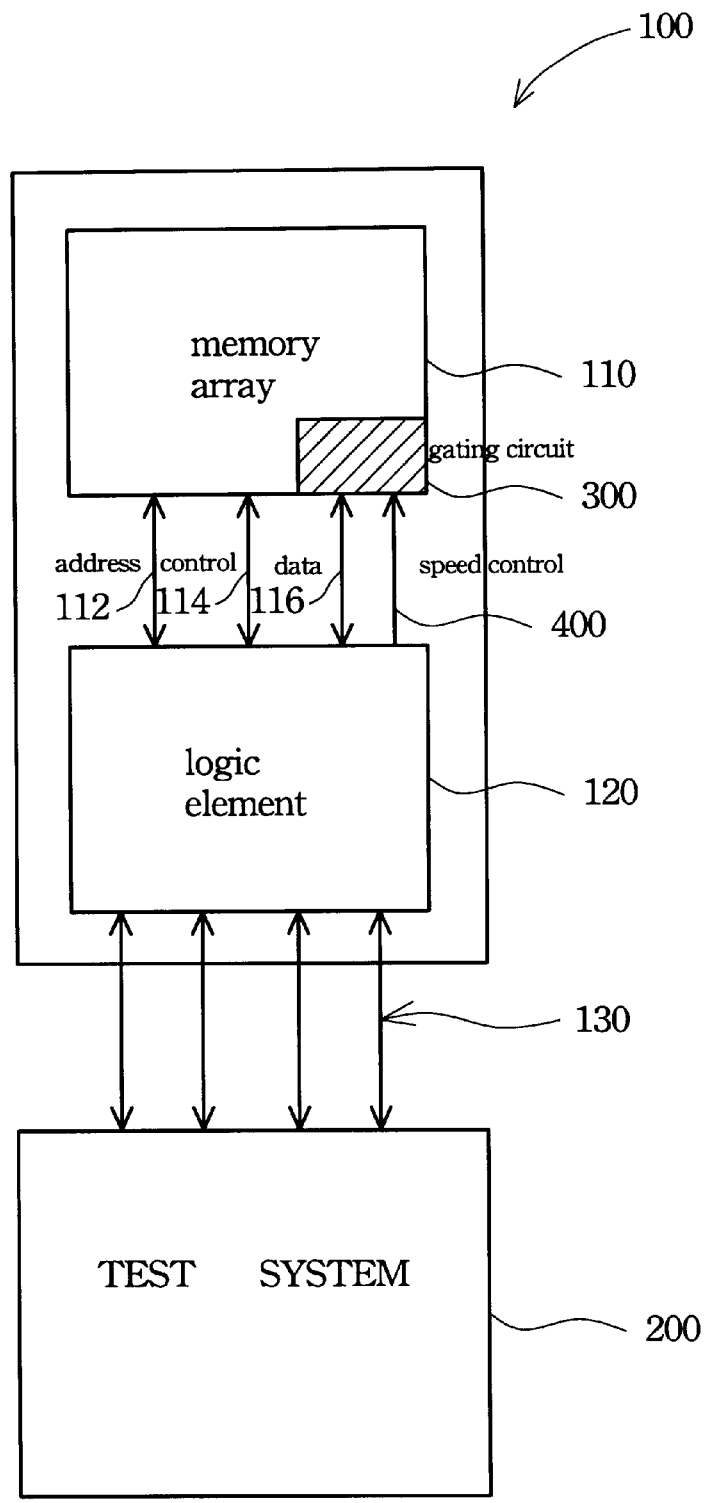
FIG. 2 is a functional block diagram of embedded flash memory of the present invention.

Referring to FIG. 2, a block diagram of an embedded flash memory of the present invention is illustrated. The embedded flash memory 100 includes a memory array 110 and a logic element 120 formed in a semiconductor substrate. The memory array 110 is composed of a plurality of flash memory cells, such as ETOX flash memory cell or split gate flash memory cell, in rows and columns.

Between the memory array 110 and the logic element 120, a plurality of transfer pins including an address pin 112, a control pin 114, a data pin 116 and a speed control pin 400 are disposed. Address, control and data signals are respectively transferred on the address pin 112, control pin 114 and data pin 116 to access data in the memory array 110 of flash memory 100. A test system 200 is connected with the logic element 120 through an external terminal 130 of the logic element 120 to transfer test signals to access data stored in the cells of memory array 110 through the logic element 120.

Figure 3:
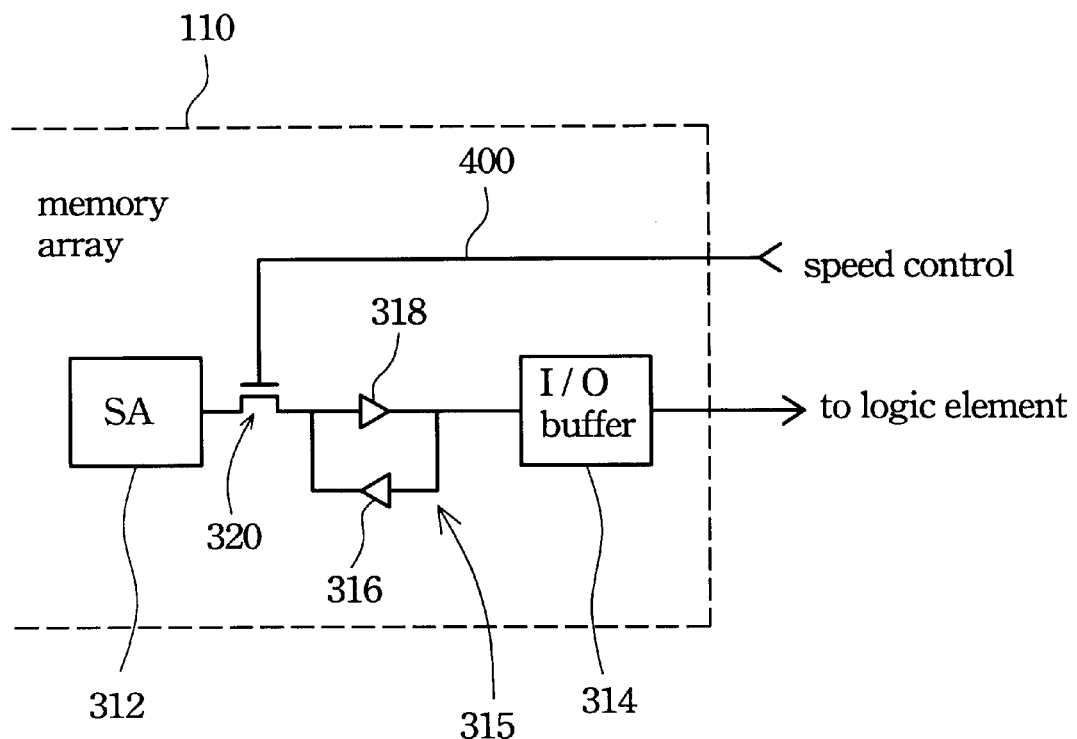
FIG. 3 is a local enlargement of gating circuit of FIG. 2.

A gating circuit 300 used to gate or interrupt a data output signal from the memory array 110 to the logic element 120 is located in the memory array 110. Referring to FIG. 3, a local enlargement of the gating circuit 300 of FIG. 2 is illustrated. In the memory array 110, a control transistor 320 and a latch circuit 315 are coupled in series between a sense amplifier (SA) 312 and an input/output (I/O) buffer 314. Data signal "0" or "1" of selected memory cell is sensed with the SA 312 and transferred to the latch circuit 315 passing through the control transistor 320. The latch circuit 315 includes a pair of cross-coupled inverters 316 and 318 that latch the input signal from the SA 312 to a logic level and an output signal to a complementary logic level to the I/O buffer 318. The output signal of the I/O buffer is transferred to the logic element 120 through the data pin 316 and is then transferred to the test system 200.

The gating circuit 300 of the present invention comprises the control transistor 312 and the speed control pin 400. The control transistor 320 connected between the SA 312 and the I/O buffer 314 is used to control the channel between the SA 312 and the I/O buffer 314. The control transistor 320, such as NMOS transistor, PMOS transistor, depletion mode NMOS transistor and depletion mode PMOS transistor, can be a triode semiconductor transistor having switch on/off function. If the control transistor 320 is a depletion mode transistor, opposite logic level corresponding to the NMOS and PMOS transistor is applied. The speed control pin 400 is connected between the gate terminal of the control transistor 320 and the logic element 120 to switch on/off the control transistor 320.

Figure 4:
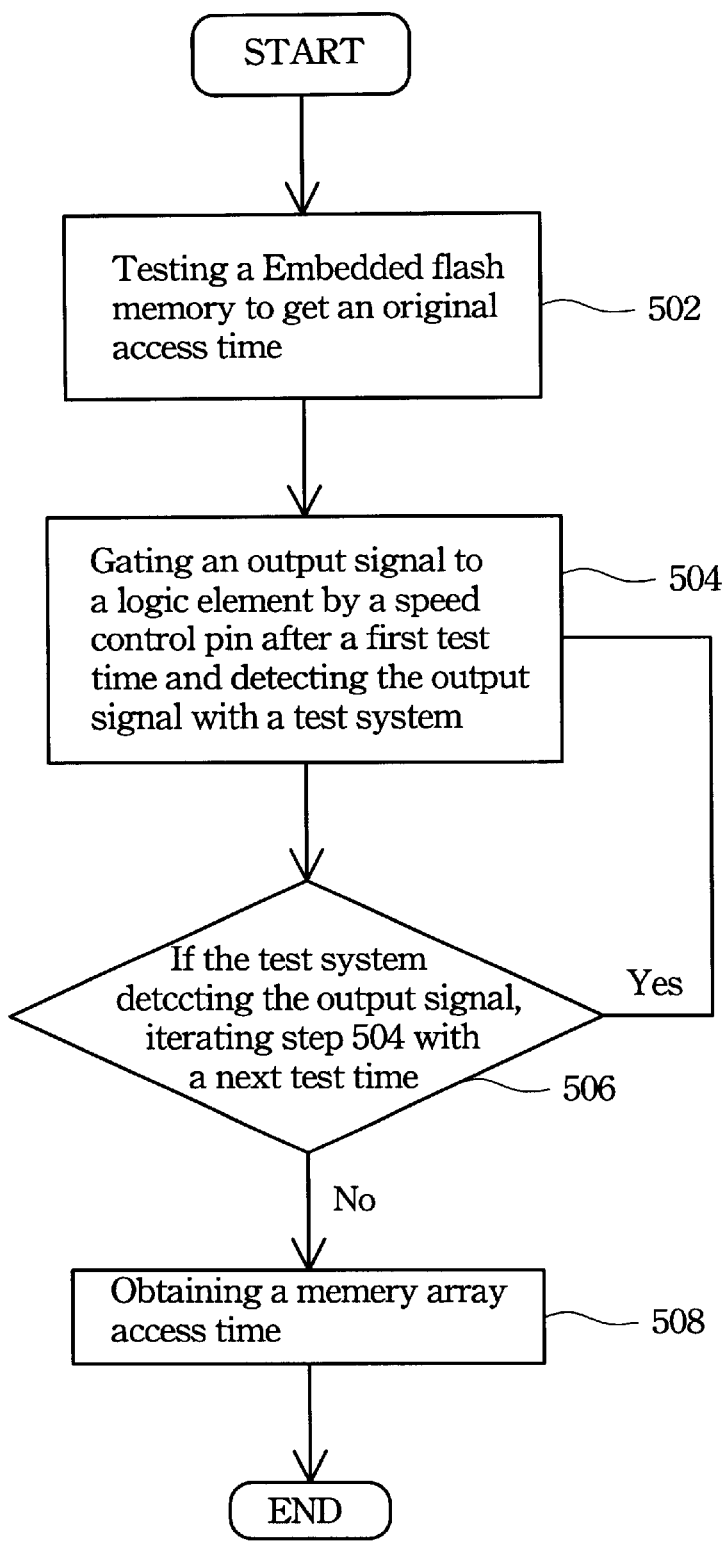
FIG. 4 is a flow chart of method for testing the embedded flash memory of the present invention.

Referring to FIG. 4, a flow chart for testing the embedded flash memory of the present invention is illustrated. During the testing of the embedded flash memory 100, the test system 200 transfers test signals to the embedded flash memory 100 and detects an output signal therefrom to obtain an original access time (step 502). Testing the embedded flash memory 100 is repeated, and a first test time shorter than the original access time is used. After the first test time, the speed control pin 400 controls the control transistor 320 to close the channel between the SA 312 and the I/O buffer 314, and thus gating the output signal from the memory array 110 to the test system 200. The output signal is then detected with the test system 200 (step 504). If the test system 200 detects the output signal after the first test time, this indicates the output signal has passed the control transistor 320. Next, a testing step with a second test time shorter than the first test time is performed and the output signal is detected with the test system 200 (step 506). By iterating the testing step with shortening test time, if the output signal is not detected with the test system 200, this indicates the test time is an access time of the memory array 110 (step 508).

According to the above description, the method and structure for testing the embedded flash memory of the present invention can delete the concerned access time from the memory array to the logic element. The access time of the memory array can be conveniently and precisely obtained to achieve predetermined operation performance.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structure.

What is claimed is:

1. A method for testing memory array in an embedded flash memory including a memory array and a logic element, the memory array connected to a test system through the logic element, the method comprising:
   a) testing the memory array to obtain an original access time;
   b) gating an output signal from the memory array to the test system by a speed control pin after a first test time and detecting the output signal with the test system;
   c) if the test system detecting the output signal, iterating the step (b) with a second test time; and
   d) obtaining a memory array access time if the test system detecting the output signal in step (c).

2. The method according to claim 1, wherein the first test time is shorter than the original access time.

3. The method according to claim 1, wherein the second test time is shorter than the first test time.

4. The method according to claim 1, wherein the speed control pin is connected to a gating circuit in the memory array.

5. The method according to claim 4, wherein the gating circuit comprises a control transistor connected between a sense amplifier and an I/O buffer.

6. The method according to claim 5, wherein the speed control pin is coupled to the gate terminal of the control transistor to open and close the channel between the sense amplifier and I/O buffer.

7. A gating circuit for testing a memory array in an embedded flash memory including a memory array and a logic element, the memory array connected to a test system through the logic element, the gating circuit comprising:
   a control transistor connected between a sense amplifier and an I/O buffer; and
   a speed control pin connected between the logic element and a gate terminal of the control transistor to gate an output signal from the memory array to the test system by switching on/off the control transistor.

8. The gating circuit according to claim 7, wherein the speed control pin turns off the control transistor after a test time, and then the output signal is detected with the test system.

9. The gating circuit according to claim 7, wherein the control transistor is NMOS transistor, PMOS transistor, depletion mode NMOS transistor or depletion mode PMOS transistor.

10. An embedded flash memory, at least comprising:
    a memory array;
    a logic element;
    control transistor connected between a sense amplifier and an I/O buffer; and
    a speed control pin connected between the logic element and a gate terminal of the control transistor to gate an output signal from the memory array to the test system by switching on/off the control transistor.

11. The memory according to claim 10, wherein the speed control pin turns off the control transistor after a test time.

12. The memory according to claim 10, wherein the control transistor is NMOS transistor, PMOS transistor, depletion mode NMOS transistor or depletion mode PMOS transistor.

* * * * *